(12) United States Patent
Stoffels et al.

(10) Patent No.: US 10,263,069 B2
(45) Date of Patent: Apr. 16, 2019

(54) III-NITRIDE BASED SEMICONDUCTOR DEVICE WITH LOW VULNERABILITY TO DISPERSION AND BACKGATING EFFECTS

(71) Applicant: IMEC VZW, Leuven (BE)

(72) Inventors: Steve Stoffels, Haasrode (BE); Yoganand Saripalli, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/452,955

(22) Filed: Mar. 8, 2017

(65) Prior Publication Data

US 2017/0263700 A1   Sep. 14, 2017

(30) Foreign Application Priority Data

Mar. 8, 2016   (EP) ..................................... 16159090

(51) Int. Cl.
*H01L 29/06* (2006.01)
*H01L 21/225* (2006.01)
(Continued)

(52) U.S. Cl.
CPC ...... *H01L 29/0634* (2013.01); *H01L 21/2258* (2013.01); *H01L 21/28575* (2013.01);
(Continued)

(58) Field of Classification Search
CPC ........... H01L 21/2258; H01L 21/28575; H01L 21/30612; H01L 21/3245; H01L 29/0634;
(Continued)

(56) References Cited

U.S. PATENT DOCUMENTS

2009/0267078 A1   10/2009   Mishra et al.
2010/0289067 A1   11/2010   Mishra et al.
(Continued)

FOREIGN PATENT DOCUMENTS

EP         2884539 A1   6/2015

OTHER PUBLICATIONS

European Search Report, European Patent Application No. 16159090.6, dated Sep. 20, 2016, 9 pages.
(Continued)

*Primary Examiner* — Syed I Gheyas
(74) *Attorney, Agent, or Firm* — McDonnell Boehnen Hulbert & Berghoff LLP

(57) ABSTRACT

The present disclosure is related to a III-Nitride semiconductor device comprising a base substrate, a buffer layer, a channel layer, a barrier layer so that a 2-dimensional charge carrier gas is formed or can be formed near the interface between the channel layer and the barrier layer, and at least one set of a first and second electrode in electrical contact with the 2-dimensional charge carrier gas, wherein the device further comprises a mobile charge layer (MCL) within the buffer layer or near the interface between the buffer layer and the channel layer, when the device is in the on-state. The device further comprises an electrically conductive path between one of the electrodes and the mobile charge layer. The present disclosure is also related to a method for producing a device according to the present disclosure.

16 Claims, 5 Drawing Sheets

(51) Int. Cl.
*H01L 21/285* (2006.01)
*H01L 21/306* (2006.01)
*H01L 21/324* (2006.01)
*H01L 29/20* (2006.01)
*H01L 29/205* (2006.01)
*H01L 29/778* (2006.01)
*H01L 29/861* (2006.01)
*H01L 29/417* (2006.01)
*H01L 29/10* (2006.01)
*H01L 29/423* (2006.01)
*H01L 29/207* (2006.01)

(52) U.S. Cl.
CPC .... *H01L 21/30612* (2013.01); *H01L 21/3245* (2013.01); *H01L 29/1075* (2013.01); *H01L 29/2003* (2013.01); *H01L 29/205* (2013.01); *H01L 29/41766* (2013.01); *H01L 29/7783* (2013.01); *H01L 29/7786* (2013.01); *H01L 29/7787* (2013.01); *H01L 29/861* (2013.01); *H01L 29/207* (2013.01); *H01L 29/4175* (2013.01); *H01L 29/42316* (2013.01)

(58) Field of Classification Search
CPC ............. H01L 29/1075; H01L 29/2003; H01L 29/205; H01L 29/207; H01L 29/4175; H01L 29/41766; H01L 29/42316; H01L 29/7783
See application file for complete search history.

(56) References Cited

U.S. PATENT DOCUMENTS

| | | |
|---|---|---|
| 2013/0248874 A1 | 9/2013 | Kuraguchi |
| 2015/0021552 A1* | 1/2015 | Mishra ................ H01L 29/2003 257/20 |

OTHER PUBLICATIONS

Stoffels, S. et al., "The Physical Mechanism of Dispersion Caused by AlGaN/GaN Buffers on Si and Optimization of Low Dispersion", Proceedings of the International Electron Devices Meeting (IEDM), 2015, pp. 911-914.

* cited by examiner

III-NITRIDE BASED SEMICONDUCTOR DEVICE WITH LOW VULNERABILITY TO DISPERSION AND BACKGATING EFFECTS

CROSS-REFERENCE TO RELATED APPLICATION

The present application is a non-provisional patent application claiming priority to European Patent Application No. 16159090.6 filed Mar. 8, 2016, the contents of which are hereby incorporated by reference.

TECHNICAL FIELD

The present disclosure is related to semiconductor devices comprising III-nitride layers forming a heterojunction between a high band gap and a low band gap material, to thereby create a high electron mobility layer, also referred to as a "2-dimensional electron gas" or "2DEG" in the low band gap material. The present disclosure is for example related to high power devices, such as High Electron Mobility Transistors (HEMT) produced on a silicon substrate, and wherein the III-nitride layers comprise a buffer layer on the substrate and at least a stack of a GaN channel layer and an AlGaN barrier layer on the buffer.

BACKGROUND

One problem occurring in GaN based power components is dispersion. Dispersion is the change of the resistance of the channel (2DEG) after stressing the transistor, for example by applying a bias voltage to the drain, either in off-state, semi-on state or on-state, thereby creating an electric field transversal to the GaN based buffer layer, between the drain and the source-connected substrate. This buffer layer is one of the primary contributors for dispersion. The buffer typically has a high amount of point defects and threading dislocations due to heteroepitaxial growth on a foreign substrate (e.g. silicon), which could be potential charge trapping sites in the buffer. The buffer is also typically doped explicitly with dopants that can form either deep acceptors or donors, exacerbating the issue. Furthermore, the buffer typically is graded (for strain relief), creating a band offset between different parts of the buffer. There are built-in electric fields arising in the buffer due to the polarized nature of the material system. This can create potential wells, which can trap mobile charges in the buffer. All these contributions can lead to a high amount of charge trapping in the buffer when the buffer is stressed under a high potential. This charge trapping can then lead to the aforementioned channel (2DEG) dispersion.

Another problem is the so-called back-gating effect, which occurs when a GaN buffer is grown on a conductive carrier substrate, as is the case for GaN-on-Si. The conductive carrier can act as a backgate, meaning that it can control the electron concentration in the channel when a bias is applied to the carrier substrate. In particular, when the potential between the source (or drain) terminal and the substrate is negative, the channel will tend to deplete. This effect tends to cause issues when two transistors are co-integrated on the same substrate, typically referred as a "high side switch" and a "low side switch." The two transistors need to share a common terminal at the substrate. A situation can therefore occur for which the carrier substrate is at a high negative potential compared to the channel of one of the transistors which is supposed to be in the on-state and creating unwanted depletion of its channel and thus increase the on-resistance of that transistor and decrease the efficiency of the system.

U.S. Patent App. Pub. No. 2010/0289067 is related to a device provided with a dispersion blocking layer between the channel layer and the buffer. A sheet or distribution of negative charge at an interface of the channel layer and the dispersion blocking layer confines electrons away from the buffer layer. The negative charge distribution is obtained by polarization or doping and is confined to the interface between the channel layer and the blocking layer.

U.S. Patent App. Pub. No. 2013/0248874 is related to a nitride transistor configured to be able to sink electron and hole currents which are generated under avalanche operation of the device. It requires an energy minimum near the interface between the channel layer and backbarrier layer, which will attract holes during avalanching and is thus able to sink the hole current under this condition.

SUMMARY OF THE DISCLOSURE

The present disclosure is related to a III-nitride device and methods for producing the device, in accordance with the appended claims, which can help address some or all of the above-described problems.

The present disclosure is first related to a III-Nitride semiconductor device comprising:
- a base substrate,
- on the base substrate, a buffer layer,
- on the buffer layer, a channel layer,
- on the channel layer, a barrier layer, so that a 2-dimensional charge carrier gas is formed or can be formed near the interface between the channel layer and the barrier layer, and
- at least one set of a first and second electrode in electrical contact with the 2-dimensional charge carrier gas, so that the charge carrier gas forms a current path between the two electrodes, when the device is in the on-state. The device is configured to operate in two or more conditions, comprising at least an on-state in which the device is capable of conducting current and an off state in which current is blocked. In the on-state, a controllable current flows in a pre-defined sense, e.g. from the first to second electrode.

The device may further comprise:
- at least one mobile charge layer (MCL) within the buffer layer or near the interface between the buffer layer and the channel layer, and
- an electrically conductive path between one of the electrodes and the mobile charge layer.

The device of the present disclosure can be further configured so that the mobile charge layer shields the 2-dimensional charge carrier gas from an electric field generated by trapped charges in the buffer layer and/or generated by a substrate bias, when the device is in the on-state, e.g. regardless of the polarity of the electric field.

According to an example embodiment, the device comprises a mobile charge generating layer (MCGL) located between the buffer layer and the channel layer or located within the buffer layer as a sublayer of the buffer layer, and wherein the mobile charge layer MCL is a 2-dimensional electron gas (2DEG) or a 2-dimensional hole gas (2DHG) formed near an interface between the mobile charge generating layer and a layer directly above and/or below it.

According to an example embodiment, the thickness of the MCGL can be between 0.1 nm and 20 nm. The MCGL may be a non-doped single layer or a multilayer. The mobile charge layer may be formed within the buffer layer, by dopants in the buffer layer.

According to an example embodiment, the buffer layer comprises a portion containing trapped charges, and wherein the MCL is located above the portion.

According to an example embodiment, the device can be a transistor, with the first and second electrode playing the part of the source and drain of the transistor, or a diode with the first and second electrode playing the part of the cathode and anode of the diode.

According to an example embodiment, the conductive path can be an electrical contact obtainable by a deposition of metal into a recess.

According to an example embodiment, the conductive path can be obtainable by diffusion of a metal at least into the barrier layer and the channel layer.

The conductive path may extend down from one of the electrodes and reach down beyond the location of the mobile charge layer or layers.

Example III-Nitride devices according to the present disclosure may comprise multiple transistors and/or diodes on the same base substrate, wherein the MCL is a mobile charge layer interrupted by field oxide regions which isolate the multiple transistors and/or diodes from each other.

The present disclosure is also related to a method for producing a III-nitride semiconductor device according to the present disclosure, comprising the steps of:
  producing the buffer layer on the base substrate,
  producing the mobile charge layer either within the buffer layer, or producing the mobile charge generating layer on top of the buffer layer,
  producing the channel layer on the buffer layer or on the MCGL, wherein in the latter case, the MCL is created near an interface between the mobile charge generating layer and a layer directly above or below it,
  producing the barrier layer on the channel layer, so that a 2-dimensional charge carrier gas is formed or can be formed near the interface between the channel layer and the barrier layer,
  producing the conductive path in electrical contact with the MCL or MCLs and through the channel and barrier layers,
  producing at least two electrodes in electrical contact with the 2-dimensional charge carrier gas, and wherein one of the two electrodes is in electrical contact with the conductive path.

According to an embodiment of the method, the conductive path is produced by making a recess through the barrier and channel layers and at least down to the MCL or MCLs, and filling the recess with a metal.

The conductive path may be produced by depositing a metal on an area of the barrier layer, and performing an annealing step wherein the metal diffuses at least into the barrier layer and the channel layers.

DETAILED DESCRIPTION

Figure 1:
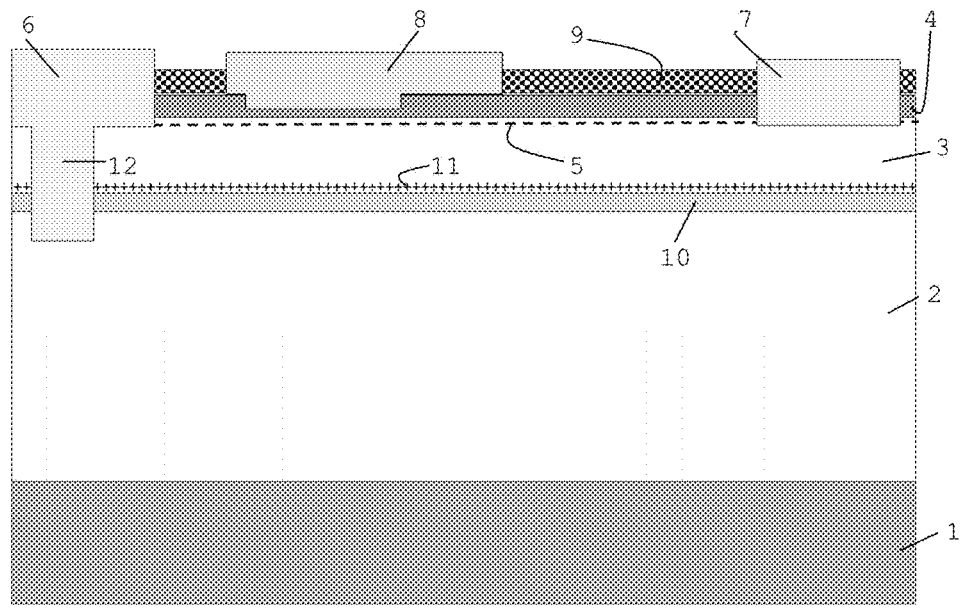
FIG. 1 illustrates a III-nitride transistor according to an example embodiment.

FIG. 1 shows a III-nitride transistor according to the present disclosure. The transistor will be described hereafter as a GaN/AlGaN based device, even though the present disclosure is not limited to these materials. The substrate 1 may be any suitable substrate on which a III-nitride transistor may be grown, such as silicon, silicon carbide or sapphire. The buffer layer 2 may be structured as any known type of buffer layer. The purpose of the buffer is to alleviate the effects of the mismatch between the lattice constants of the substrate 1 and the active layers of the device. When the substrate 1 is conductive, like a Si substrate, the buffer should also be able to sustain the vertical electrical fields which are put over it during operation.

The buffer layer 2 may for example comprise an AlN nucleation layer grown on a silicon substrate 1, and a stack of AlGaN layers with stepwise decreasing Al-concentration. The active layers comprise the channel layer 3 which is typically a substantially defect-free GaN layer, and the barrier layer 4 which may be an AlGaN layer of a composition chosen so that a 2DEG (2-dimensional electron gas) 5 may be formed in the channel layer 3, near the interface between the channel layer 3 and the barrier layer 4. Source and drain electrodes 6, 7 are in electrical contact with the 2DEG 5, and a gate electrode 8 is produced between the source and drain. The 2DEG 5 may either be present under zero applied gate bias (normally ON device), or it may be formed only in the access regions on either side of the gate 8, and then when a sufficiently positive gate bias is applied it is formed also in the gate region (normally OFF). For a normally OFF transistor there is typically a distinction made in the fabrication process of the gate region versus the access region (e.g. gate recess or the addition of a p-type doped layer in the gate region). What counts is therefore that a continuous 2DEG can be formed between the source and drain electrodes. A cap layer 9, for example a SiN layer, protects the active layers of the device and passivates the surface of the barrier 4. Theoretically, a 2-dimensional hole gas (2DHG) may form the channel instead of a 2DEG, hence the general term "2-dimensional charge carrier gas" used in the appended claims. This may depend on the actual materials used in the channel and barrier layers. In most known GaN based devices however, a 2DEG is formed, and this will also be assumed in the following description.

The charge concentration of the 2DEG 5 can be modulated by the buffer 2 by either applying an explicit bias to the substrate 1 (hereafter referred to as "bulk bias"), or when charge is trapped in the buffer. If negative charge is trapped (or a negative bulk bias is applied), the 2DEG concentration is decreased. Conversely if positive charge is trapped (or a positive bulk bias is applied), the 2DEG concentration is increased. Charge injected into the buffer 2 can be trapped either at trapping sites (e.g. point defects, defects, impurities, etc.), or as mobile charge at potential barriers.

In the example embodiment shown in FIG. 1, a layer 10 is present between the buffer layer 2 and the channel layer 3. This layer 10 is referred to as the mobile charge generating layer (MCGL). It can be any layer of a composition chosen to create a mobile charge layer (MCL) 11. In the embodiment shown, the MCL 11 is a 2DHG formed in the channel layer 3, near the interface between this channel layer 3 and the MCGL 10, as a consequence of the band gap difference between the channel layer 3 and the MCGL 10. In the embodiment of FIG. 1, the MCGL 10 may for example be an AlN layer of about 10 nm thick, in direct contact with the GaN channel layer 3.

In addition to this MCGL 10 and thereby generated MCL 11, the device of FIG. 1 comprises an electrically conductive path 12 between the source electrode 6 and the MCL 11. This conductive path will hereafter be referred to as the "MCL contact" 12. The MCL contact allows charge to flow into and out of the MCL 11. The MCL 11 as such effectively shields the channel's 2DEG 5 from the buffer layer 2, thereby mitigating dispersion caused by trapped charges in the buffer.

If a bulk bias is applied to the substrate 1, mobile charge will be injected into the MCL 11, which effectively shields the 2DEG from the substrate potential. If the bias is removed, the mobile charge in the MCL 11 can flow out through the MCL contact 12. The MCL 11 will shield the channel from any residual charge trapped in the buffer during the on-state of the transistor.

The 2DEG 5 forms a current path between the source and drain when the device is in the on-state, e.g. when the gate voltage is such that the 2DEG is not depleted under the gate, and the voltage difference between the source and drain is in a given operational range, which may be for example between 0.5 and 1V. In general terms, the on-state of a device according to the present disclosure is the state wherein the device is conductive in a controllable manner, e.g. a channel is created under the influence of the voltage levels of two electrodes (and possibly a third electrode, namely a gate electrode in the case of a transistor), so that a controlled current flows in well-defined sense (e.g. source to drain) from one electrode to the other. A reverse breakdown state is therefore not an "on-state."

It is in this on-state that a stable resistance of the current path is required, e.g. a mitigation of dispersion and/or back bias. The reference to this aim of the present disclosure, namely the mitigation of dispersion, implies that the device of the present disclosure can be configured so that the shielding effect obtained by the MCL occurs during the on state of the device, e.g. the MCL is generated during the on-state. As stated, the MCL11 is configured to shield the 2-dimensional charge carrier gas (such as the 2DEG 5) from an electric field generated by trapped charges in the buffer layer 2 and/or generated by a substrate bias, when the device is in the on-state. The MCL 11 thus acts as a shielding layer which compensates the electric field generated by charges trapped in the buffer and/or by the substrate bias. In other words, the field lines from the charge trapped in the buffer terminate on the MCL 11 and not on the channel 2DEG 5, thereby avoiding the depletion of the latter. This means that the MCL can be designed so as to be able to compensate for trapped charges which are known to be present in the buffer, as well as charges which become trapped in the buffer during operation of the device. Also, the MCL can be designed to be able to compensate for fluctuations of the substrate bias, for example in the case where two nitride transistors are produced on the same substrate (see example further in text), where one transistor may influence the substrate bias experienced by the other and vice versa. The fact that the MCL 11 can be present in the on-state of the device implies that the MCL can be configured to establish this compensation effect regardless of the polarity of the trapped charge and/or the substrate bias. This means that the device can be designed (for example by adequate design of the composition and band structure of the MCGL 10 with respect to its adjacent layers) so that the MCL density is sufficiently high in order to compensate for the electric field generated by trapped charges or a back bias defined by a polarity that acts to deplete the MCL. In the opposite case, e.g. when the trapped charges or back bias have opposite polarity to the one that acts to deplete the MCL, the shielding effect is self-regulating: the higher the electric field of the charges in the buffer or of the applied back bias, the more charge will flow into the MCL 11 and the higher the compensation effect.

This deliberate design in order to obtain a compensating charge layer capable of shielding the channel layer is not known in the art. In particular, this distinguishes the devices of the present disclosure from the device described in U.S. Patent App. Pub. No. 2013/0248874, wherein a 2DEG and a 2DHG are only required to form simultaneously when the device is at avalanche breakdown condition. The device is however not designed to form a 2DHG when the device is in the on-state, let alone a 2DHG that is configured to compensate trapped charges in the buffer and/or to compensate a back bias, regardless of the polarity of the trapped charges or the back bias.

When the device of the present disclosure is turned off, by modifying the gate voltage so as to deplete the 2DEG and by applying a high drain bias voltage, the MCL of the device may disappear. For example, the hole gas 11 in FIG. 1 disappears by depletion of the 2DHG.

The mechanism by which dispersion is mitigated in a device according to the present disclosure is furthermore fundamentally different compared to the dispersion blocking layer of U.S. Patent App. Pub. No. 2010/0289067. This dispersion blocking layer increases channel confinement so that charges do not get trapped in the buffer, i.e. the aim is to avoid that charge flows in the buffer and gets trapped there. In a device of the present disclosure, dispersion is reduced even if there is charge trapping in the buffer.

In the embodiment of FIG. 1, the MCL 11 is formed in the channel layer 3, near the interface with the MCGL 10. This is why in this particular embodiment, the MCL 11 can be a 2-dimensional hole gas, rather than a 2-dimensional electron gas, which might reduce the confinement of the channel 2DEG 5. Depending on the exact composition of the layers, the MCL 11 may also be formed in the MCGL itself. In the latter case, the MCL could be either a 2DEG or a 2DHG. So the present disclosure is related to embodiments wherein the MCL is either a 2DEG or 2DHG, depending on the precise configuration. Also, a mobile charge layer 11 may be formed on both sides of the MCGL, depending on the composition of the lower part of the MCGL compared to the layer directly underneath this lower part. In these embodiments, both MCLs can play the active part as described above, of shielding the channel 2DEG from the electric fields generated by trapped charges and/or by a substrate bias, through charge being injected into or flowing out of the MCLs, provided that the MCL contact is configured to contact both the MCLs.

Furthermore, the production of a single MCGL layer 10 such as the AlN layer described in the embodiment of FIG. 1, between the buffer 2 and the channel layer 3, is not the only way in which the MCL 11 can be obtained. According to one embodiment, an intermediate layer is introduced between the channel layer 3 and the MCGL 10, which is beneficial e.g. for confinement of the channel 2DEG 5 or for the morphology of the channel layer 3. The intermediate layer therefore performs partially at least, the function of a backbarrier layer. This intermediate layer should however be included in such a way as to not introduce any dispersion by itself, either by making sure the layer is sufficiently low in defects or to make sure that it is designed such that the charge state does not change under applied bias in the intermediate layer. The intermediate layer may itself be a stack of different sublayers. One example of an intermediate layer is a stack of AlGaN layers with stepwise decreasing Al concentration on top of an AlN layer acting as the MCGL. The MCL 11 is then formed in the AlGaN layer that is in direct contact with the AlN layer.

Alternatively, the MCGL 10 itself can be a multilayer, e.g. it can consist of a stack of multiple sublayers, and may for example consist of an AlN layer grown on the buffer layer 2, and a stack of AlGaN layers with stepwise changing Al-concentration. The difference with the above-described intermediate layer is that in this embodiment, the MCL 11 is formed near the interface with the channel layer 3.

Figure 2:
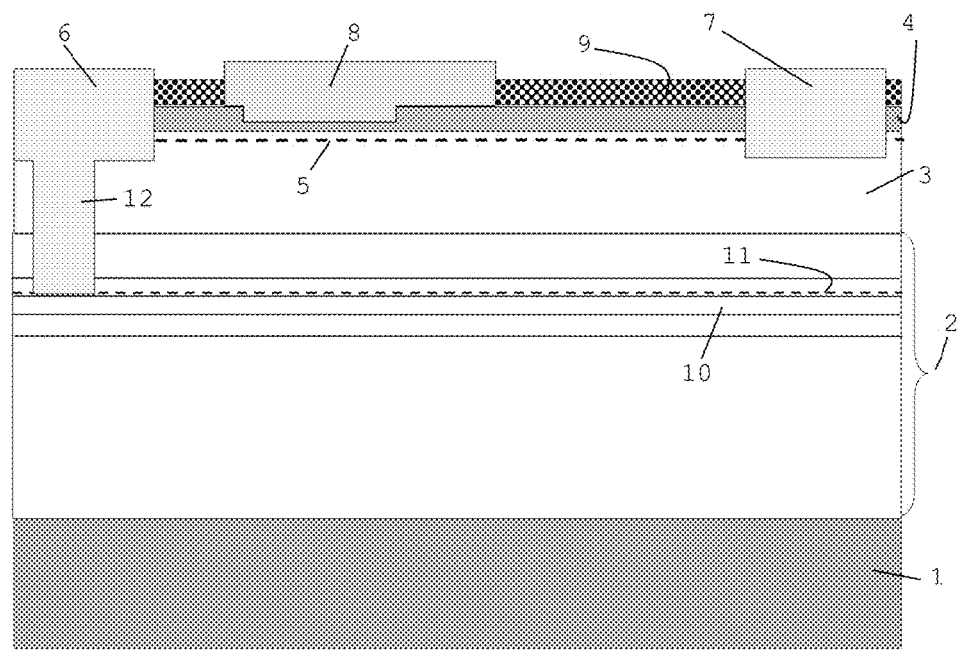
FIG. 2 illustrates another III-nitride transistor according to an example embodiment.

According to another example embodiment, the MCL layer 11 can be a 2DHG or 2DEG formed in the buffer itself. At the interface between two (Al)(In)(Ga)N layers within the buffer layer, there can be a step in the concentration of any of the atoms in the quaternary compound, which can lead to a formation of a hole or electron gas during the on-state. One of the sublayers within the buffer can then be regarded as the mobile charge generating layer (MCGL) 10. FIG. 2 illustrates this embodiment. As the MCL 11 is located within the buffer layer, the MCL contact 12 may reach deeper into the buffer in order to be able to contact the MCL 11. The MCGL 10 can thus be one of the sublayers of the buffer.

Figure 3:
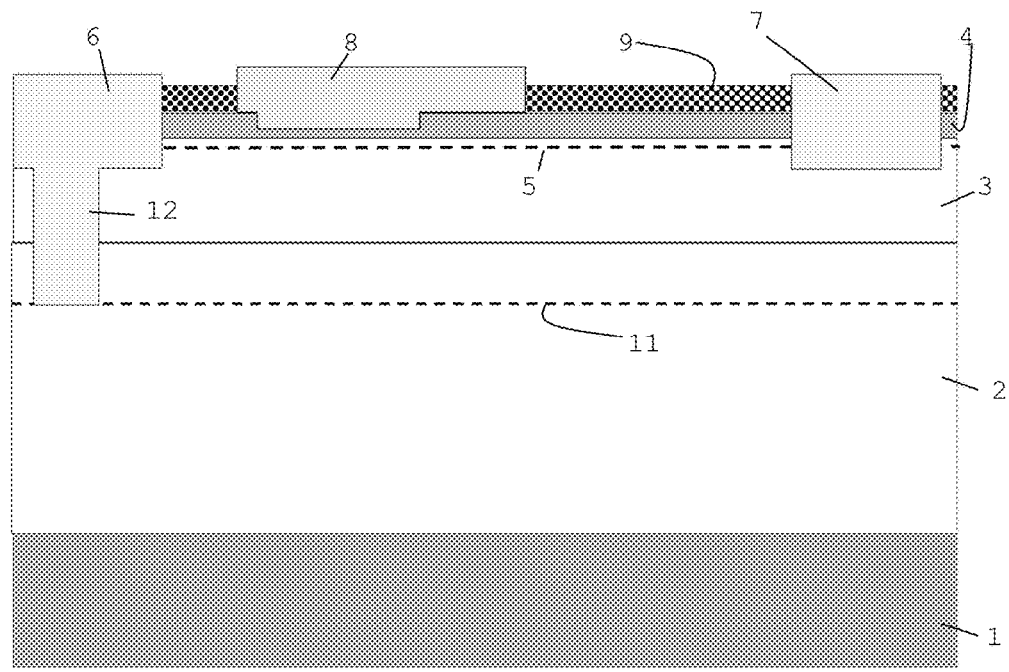
FIG. 3 illustrates another III-nitride transistor according to an example embodiment.

According to another example embodiment wherein the MCL 11 is located within the buffer 2, the MCL is created by doping a region in the buffer in such a manner that the charge remains confined at the region of doping, during the on-state. This embodiment is illustrated in FIG. 3. The doping can be done by a shallow dopant, so as not to introduce any trapping due to the dopant itself. In the case of a GaN/AlGaN device, this can be achieved by any of the dopants typically used for creating a p-type or n-type conductive region in GaN, e.g. Mg, Mn or Si. So in this example, there may be no actual MCGL layer grown on top of or as a sublayer of the buffer. In some examples, the dopant can be added in-situ, e.g. during the growth of the buffer layer 2. It is possible to create one single MCL in this way or to create multiple MCLs by multiple doping steps.

If a physical MCGL layer 10 is grown on top of or within the buffer, this MCGL layer can have a thickness anywhere between 0.1 nm up to several µm. According to an example embodiment, the MCGL layer's thickness can be between 0.1 nm and 20 nm.

When the MCL 11 is located within the buffer (as in FIGS. 2 and 3), it can be located above the part of the buffer which comprises intentionally produced trapped charges. These charges are included for regulating the leakage, and are usually confined to a particular area of the buffer. In order to mitigate the dispersion effect caused by these charges, the MCL layer or layers 11 can be located above this area.

Configuration of the device so that the MCL is formed in the on-state and is of sufficient density for compensating the electric fields regardless of their polarity, may be achieved by adequate design of the various layers in the device, or by adequate control of the doping step in the embodiment where the MCL is generated by doping a region of the buffer (as illustrated in FIG. 3 and accompanying text). The measures taken to ensure a given density of the MCL are known as such, and are not described here in detail. These measures may be the same as the measures taken to obtain the conducting charge layer that forms the channel (the 2DEG 5 in the case of the transistor of FIG. 1). The MCGL 10 is for example designed in terms of its composition and resulting band structure relative to one or both of its adjacent layers, so that an MCL is formed at a given minimum density, in the vicinity of at least one of the interfaces with the adjacent layers, when the device is in the on-state. In some examples, the MCGL can be a non-doped layer. According to an example embodiment, the non-doped MCGL can be a thin layer, for example about 10 nm thick, located between the channel layer and a backbarrier layer designed to confine the 2DEG 5 and to increase the breakdown voltage of the buffer stack. Due to the low thickness, the MCGL may not influence the breakdown voltage in an important way, while allowing the MCL to appear in the on-state. When the MCGL is non-doped, it may not itself contribute to a dispersion effect.

When a backbarrier layer is present but no MCGL, as is the case in U.S. Patent App. Pub. No. 2013/0248874, the backbarrier is typically designed for confinement of the 2DEG and control of the breakdown voltage, which requires doping of the backbarrier, which is itself a cause of dispersion. Such a backbarrier is not designed therefore for shielding the charge layer in the on-state.

The MCL contact 12 can also be fabricated in several different ways. According to an example embodiment, the MCL contact 12 can be fabricated before producing the source, drain and gate contacts, by etching a recess through the barrier layer 4 and the channel layer 3 towards the MCL 11 and forming an ohmic contact by metal deposition and alloying. When the MCL 11 is generated by a step in atomic concentration between two layers (e.g. between the MCGL 10 and the channel 3 or between two sublayers within the buffer 2), this step in atomic concentration can be exploited to form an etch stop layer, to control etch depth. Another method for etching is a timed etch or a digital recess such as e.g. an atomic layer etch (ALE). The ohmic contact can be formed by any typical method for contact formation towards GaN layers, e.g. Au-containing contacts combined with alloy, Au-free contacts combined with alloy, regrowth of an n+ GaN layer combined with metallization or other methods known as such in the art.

In another embodiment, a metal diffusion can be performed by depositing a metal in the region of interest followed by annealing to cause the metal to diffuse sufficiently deep to contact the MCL 11.

In another embodiment the MCL contact 12 can be formed by ion implantation into the barrier and channel layers 4, 3 in the region of interest, thereby creating a highly doped region serving as the MCL contact 12. For example, a Si-implant step can be performed for this purpose.

Depending on the application, the MCL contact 12 can be formed either at the source contact 6 or the drain contact 7.

The creation of the MCL contact 12 can be integrated in the process for fabricating the source and drain electrodes 6, 7. For example, two recesses can be produced at the location of the S/D electrodes, a dielectric can be deposited and patterned so that it remains only in the drain recess, a metal can be deposited in the source recess, and an annealing step as described above can be performed to diffuse the metal down to the MCL 11, thereby creating the source electrode 6 and the MCL contact 12. The dielectric can then be removed and a second metal deposition can be applied for producing the drain electrode 7. Alternatively, an additional recess can be etched within the boundaries of the source recess, while protecting the drain recess with an etch mask. Then the etch mask can be removed and metal can be deposited in the S/D recesses, thereby creating the MCL contact 12 and the S/D electrodes in one single metal deposition step. The latter method results in a device as shown in FIG. 1. The additional recess can either be a blanket recess or can be done in a pattern (e.g. squares or stripes), which can be subsequently filled and planarized with the ohmic metallization.

Figure 4:
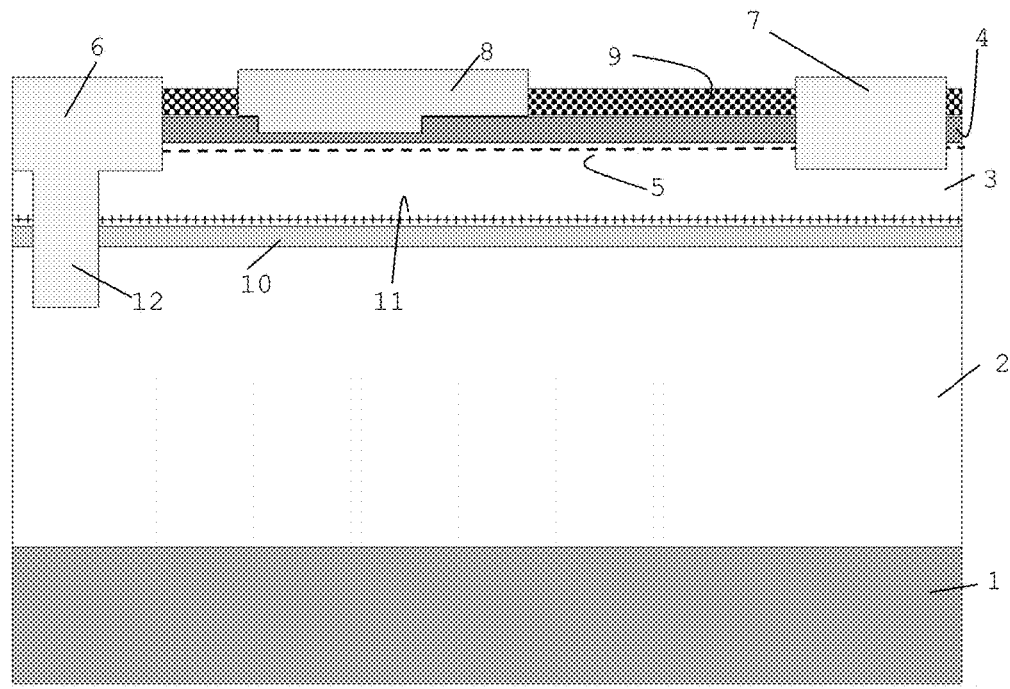
FIG. 4 illustrates another III-nitride transistor according to an example embodiment.
Figure 5:
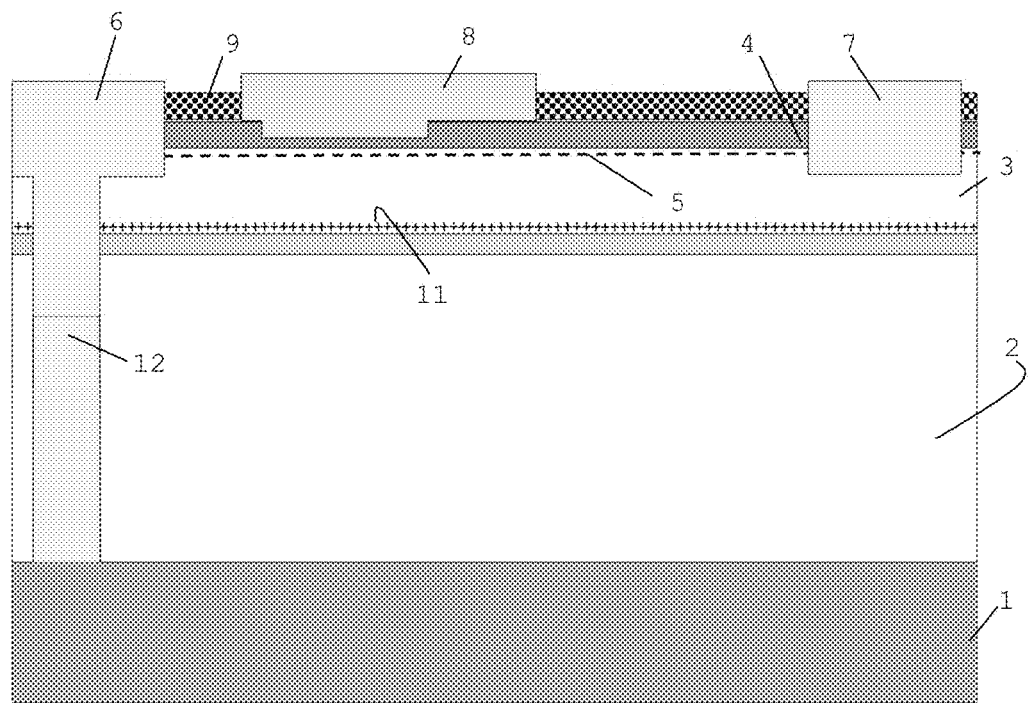
FIG. 5 illustrates another III-nitride transistor according to an example embodiment.

According to an embodiment illustrated in FIG. 4, the MCL contact 12 contacts not only the MCL layer 11 below the source or drain electrode 6, 7, but reaches deeper inside the buffer to allow the connection of any floating layers present in the buffer layer 2. As shown in FIG. 5, the MCL contact 12 can also be combined with a substrate contact wherein both the MCL 11 and substrate 1 can be contacted with a single process.

The MCL contact 12 can be processed at the beginning of the process flow or as the last step in the process by opening passivation layers and metals present at the location where the MCL contact needs to be formed.

The present disclosure is not limited to a transistor, but it is applicable to any III-nitride based device having two or more electrodes. For example the present disclosure is also related to a diode, having a cathode and anode, with an MCL layer 11 and an MCL contact 12 similar to the devices described above, in electrical connection either with the cathode or the anode. The alternatives described above in terms of how to produce the MCGL 10, the MCL 11 and the MCL contact 12 are applicable to any III-nitride based device, regardless of the exact materials and layer thicknesses applied.

Figure 6:
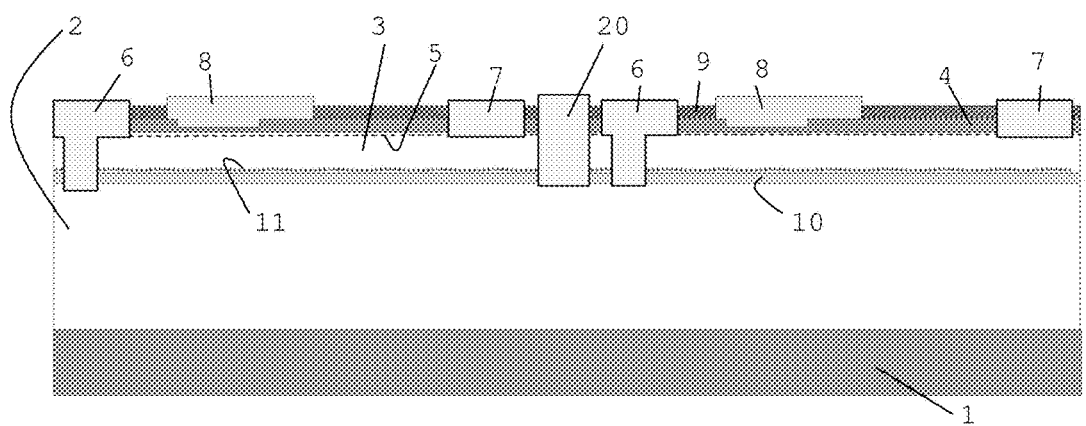
FIG. 6 illustrates a semiconductor device comprising multiple III-nitride transistors according to an example embodiment.

The present disclosure is also related to a semiconductor device comprising multiple III-nitride devices as described above, produced on the same substrate 1, for example to a device with two transistors arranged as a half bridge, with a high-side switch and a low-side switch as referred to above. Such a device may be produced by growing a single stack of a buffer layer 2, channel layer 3 and barrier layer 4, possibly with the MCGL layer 10 between the buffer and the channel layer or as a sublayer of the buffer, thereby forming the MCL or MCLs 11, or with the MCL(s) formed in the buffer by doping. The electrodes 6, 7 (or equivalently any electrodes in devices other than transistors), and the MCL contacts 12 may be formed for both transistors in any of the manners described above. According to this embodiment however, the MCL layer 11 may be interrupted between the two transistors. This may be achieved by an additional step of removing a portion of the MCL layer 11, for example by an etching step, and creation of a field oxide region 20 between the two transistors, thereby effectively isolating the transistors from each other, as illustrated in FIG. 6. Alternatively the isolation can be achieved by performing an implant isolation in region 20 by e.g. Nitrogen implantation or any known method for implant isolation in the art. Any other means to isolate and known in the art can be used to achieve isolation.

The present disclosure is additionally related to a method for producing a device according to the present disclosure. The possible methods for producing the MCGL, the MCL and the MCL contact have already been described. The methods for producing the buffer layer, the channel layer, the barrier layer, the electrodes and the cap layer can be according to any known technique in this technical domain. The materials chosen for these components as well as the layer thicknesses for the buffer layer, the channel layer, the barrier layer and the cap layer can also be according to known processes.

Test Results

The positive effect of the present disclosure on the dispersion problem was illustrated by a number of experiments. The 2DEG resistance was measured for two structures, one with and one without the MCL 11. The measurements were done according to the methodology described in the document "The physical mechanism of dispersion caused by AlGaN/GaN buffers on Si and optimization for low dispersion," Stoffels et al., proceedings of the International Electron Devices Meeting (IEDM), 2015, pp. 911-914. According to this methodology, a voltage $V_{bulk}$ is applied to the substrate, during a given duration defined by $t_{stress}$ on a III-nitride stack grown on the substrate. After a given time, the bulk voltage is removed and the resistance $R_T$ of the 2DEG resistor formed between the electrodes is measured by applying a small voltage difference (~1V) between two ohmic contacts forming the electrodes towards the 2DEG, and compared to the initial resistance $R_{init}$, measured prior to applying the bulk voltage. The ratio $R_T/R_{init}$ which gives an indication of the dispersion effect, is measured as a function of the level of the bias voltage. The stack without the MCL comprised a Si-substrate, a buffer layer comprising an AlN nucleation layer and a stack of AlGaN layers with stepwise decreasing Al-concentration, a GaN channel layer, an AlGaN barrier layer and a SiN cap layer. This structure is compared to the same structure but wherein an MCGL layer is provided between the buffer layer and the channel layer (as in FIG. 1), thereby creating a MCL in the channel layer, near the interface with the MCGL. In the tested device, the MCGL was a multilayer consisting of an AlN layer grown on the buffer layer, and a stack of AlGaN layers grown consecutively on the AlN layer with stepwise decreasing Al-concentration for each subsequent layer. The MCL contact was produced by the diffusion technique described above.

Figure 7:
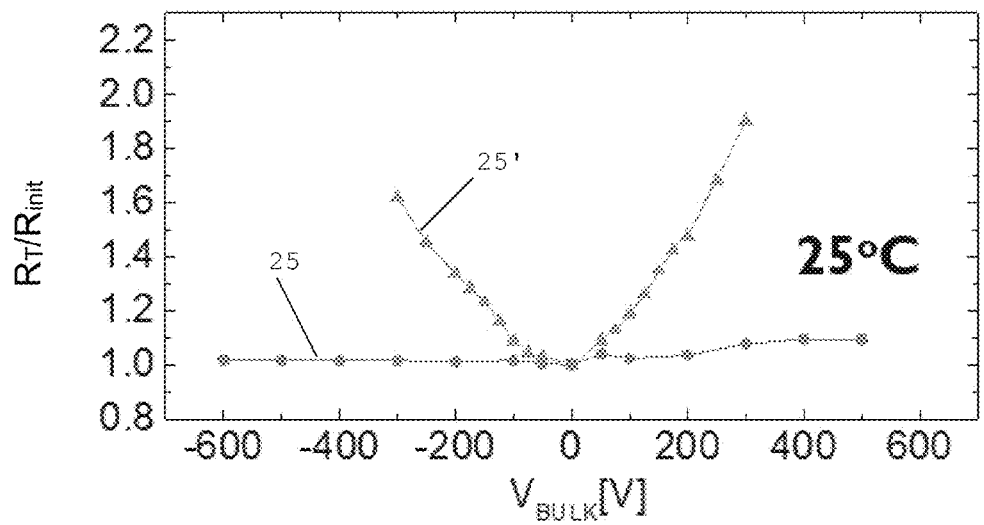
FIG. 7 is a graph illustrating device characteristics of an example III-nitride transistor.
Figure 8:
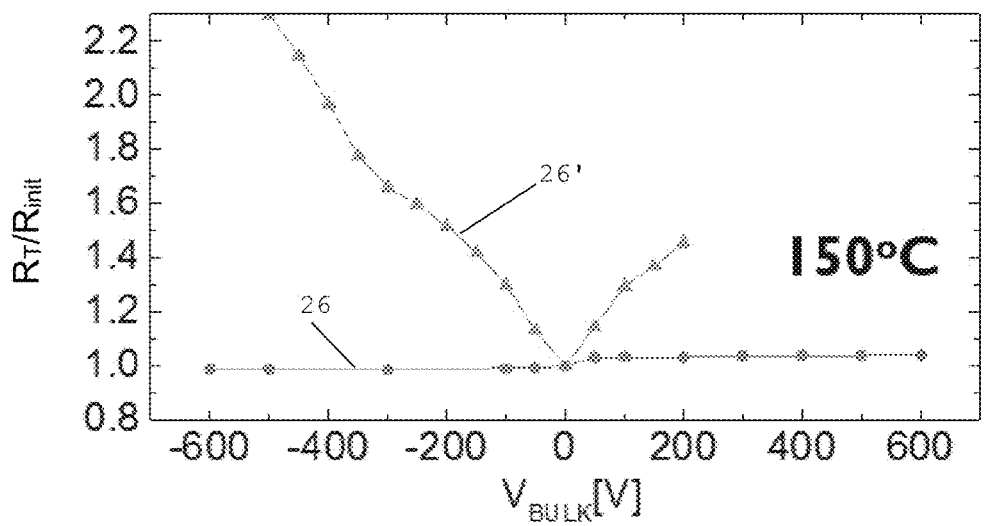
FIG. 8 is another graph illustrating device characteristics of an example III-nitride transistor.

FIGS. 7 and 8 compare the ratio $R_T/R_{init}$ at room temperature and at 150° C. respectively. It is clear that the MCL/MCL contact combination (curves 25, 26) effectively reduces the dispersion significantly compared to the sample without the MCL/MCL contact (curves 25', 26').

Figure 9:
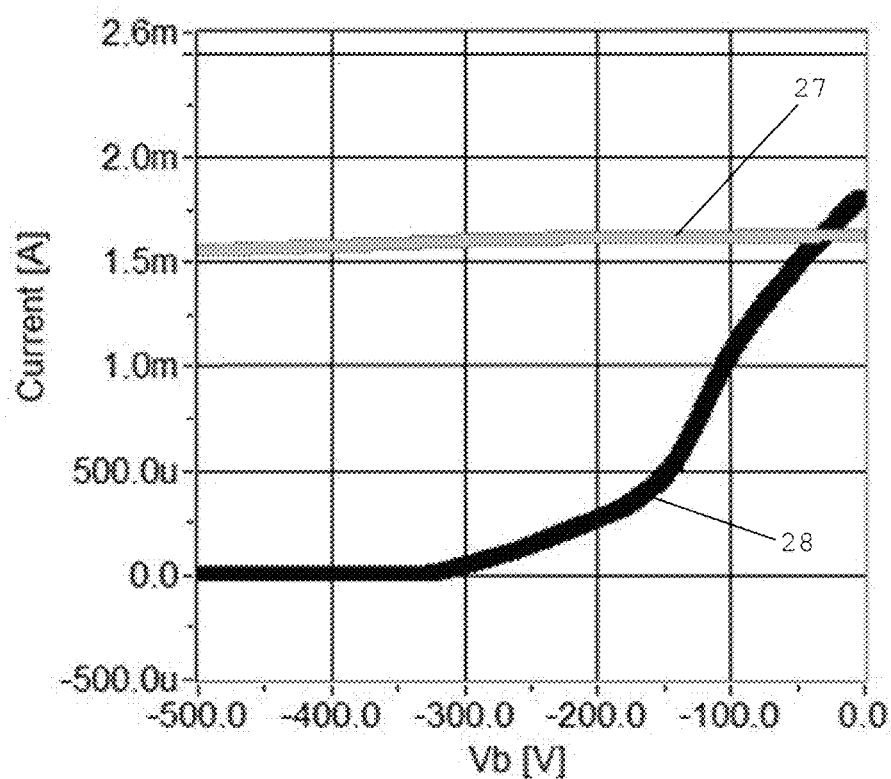
FIG. 9 is another graph illustrating device characteristics of an example III-nitride transistor.

On the same structures, e.g. with and without the MCL, the backgating effect was measured by applying a range of negative bulk voltages and measuring the current between the electrodes (ohmic contacts to the 2DEG) under the influence of a given voltage difference between the electrodes. FIG. 9 clearly shows that the structure with the MCL/MCL contact (curve 27) exhibits a stable current for a wide variety of bulk voltage levels, whereas the other structure (curve 28) experiences current loss at high negative voltage levels, due to the backgating effect. Also the self-regulating property of the device is illustrated in FIG. 9. The 2DEG concentration is effectively constant with respect to bulk bias, while normally a depletion would be expected due to capacitive coupling. The fact that the 2DEG remains constant means that the MCL is compensating the electric field due to the applied bulk bias, e.g. more charge is flowing into the MCL.

While example embodiments have been illustrated and described in detail in the drawings and foregoing description, such illustration and description are to be considered illustrative or exemplary and not restrictive. Other variations to the disclosed embodiments can be understood and effected by those skilled in the art from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used. Any reference signs in the claims should not be construed as limiting the scope.

Unless specifically specified, the description of a layer being present, deposited or produced "on" another layer or substrate, includes the options of the layer being present, produced or deposited directly on, e.g. in physical contact with, the other layer or substrate, and the layer being present, produced or deposited on one or a stack of intermediate layers between the layer and the other layer or substrate.

What is claimed is:

1. A III-nitride semiconductor device configured to operate in an on-state in which the device is capable of conducting an electrical current and an off-state in which electrical current is blocked, the device comprising:

a base substrate;

on the base substrate, a buffer layer;

on the buffer layer or within the buffer layer as a sublayer of the buffer layer, a mobile charge generating layer (MCGL), wherein the MCGL is a non-doped single layer MCGL;

on the buffer layer or on the MCGL, a channel layer;

on the channel layer, a barrier layer, wherein a 2-dimensional charge carrier gas is formed near an interface between the channel layer and the barrier layer when the device is in the on-state;

a first electrode and a second electrode, wherein the first and second electrodes are configured to make electrical contact with the 2-dimensional charge carrier gas, such that the charge carrier gas forms a current path between the first and second electrodes when the device is in the on-state; and at least one mobile charge layer (MCL) that is a 2-dimensional electron gas (2DEG) or a 2-dimensional hole gas (2DHG) formed near an interface with the MCGL, wherein one of the first electrode or the second electrode is configured to make electrical contact with the MCL, and wherein the MCL shields the 2-dimensional charge carrier gas from an electric field generated by charges in the buffer layer or in the substrate when the device is in the on-state.

2. The III-nitride device of claim 1, wherein the thickness of the MCGL is between 0.1 nm and 20 nm.

3. The III-nitride device of claim 1, wherein the MCL is formed within the buffer layer by dopants in the buffer layer.

4. The III-nitride device of claim 1, wherein the buffer layer comprises a plurality of trapped charges, and wherein the MCL is located above the plurality of trapped charges.

5. The III-nitride device of claim 1, wherein the device is a transistor or a diode, and wherein the first and second electrodes respectively comprise a source and drain of the transistor or a cathode and anode of the diode.

6. The III-nitride device of claim 1, wherein the first electrode or the second electrode is configured to make electrical contact with the MCL via a conductive path formed by depositing a metal into a recess through the barrier and channel layers.

7. The III-nitride device of claim 1, wherein the first electrode or the second electrode is configured to make electrical contact with the MCL via a conductive path formed by diffusing a metal at least into the barrier layer and the channel layer.

8. The III-nitride device of claim 1, wherein the first electrode or the second electrode is configured to make electrical contact with the MCL via a conductive path that extends from the first electrode or the second electrode to a location below the MCL.

9. The III-nitride device of claim 1, further comprising multiple transistors or diodes on the base substrate, and wherein the MCL is interrupted by one or more field oxide regions that isolate the multiple transistors or diodes from each other.

10. A method for producing a III-nitride semiconductor device configured to operate in an on-state in which the device is capable of conducting an electrical current and an off-state in which the electrical current is blocked, the method comprising:

producing a buffer layer on a base substrate;

producing a mobile charge generating layer (MCGL) either within the buffer layer or directly on the buffer layer, wherein the MCGL is a non-doped single layer MCGL, and wherein the MCGL is configured to generate a mobile charge layer (MCL) that is a 2-dimensional electron gas (2DEG) or a 2-dimensional hole gas (2DHG) near an interface between the MCGL and one or more other layers of the semiconductor device;

producing a channel layer on the buffer layer or on the MCGL;

producing a barrier layer on the channel layer, wherein a 2-dimensional charge carrier gas is formed near an interface between the channel layer and the barrier layer when the device is in the on-state;

producing a conductive path in electrical contact with the MCL, wherein the conductive path extends through the channel and barrier layers; and producing a first electrode and a second electrode, wherein the first and second electrodes are configured to make electrical contact with the 2-dimensional charge carrier gas, and wherein one of the first or second electrodes is in electrical contact with the conductive path.

11. The method of claim 10, wherein producing the conductive path comprises:

making a recess that extends through the barrier and channel layers at least to the MCL; and filling the recess with a metal.

12. The method of claim 10, wherein producing the conductive path comprises:

depositing a metal on the barrier layer; and performing an annealing step wherein the metal diffuses at least into the barrier layer and into the channel layer.

13. A method for producing a III-nitride semiconductor device configured to operate in an on-state in which the device is capable of conducting an electrical current and an off-state in which the electrical current is blocked, the method comprising:

producing a buffer layer on a base substrate;

producing a mobile charge generating layer (MCGL) directly on the buffer layer, wherein the MCGL is a non-doped single layer MCGL;

producing a channel layer on the MCGL, wherein the MCGL is configured to generate a mobile charge layer (MCL) that is a 2-dimensional electron gas (2DEG) or a 2-dimensional hole gas (2DHG) near an interface between the MCGL and the channel layer or near an interface between the MCGL and the buffer layer;

producing a barrier layer on the channel layer, wherein a 2-dimensional charge carrier gas is formed near an interface between the channel layer and the barrier layer when the device is in the on-state;

producing a conductive path in electrical contact with the MCL, wherein the conductive path extends through the channel and barrier layers; and producing a first electrode and a second electrode, wherein the first and second electrodes are configured to make electrical contact with the 2-dimensional charge carrier gas, and wherein one of the first or second electrodes is in electrical contact with the conductive path.

14. The method of claim 13, further comprising doping a plurality of regions in the buffer layer, thereby producing a plurality of MCLs within the buffer layer.

15. The method of claim 13, wherein producing the conductive path comprises:
making a recess that extends through the barrier and channel layers at least to the MCL; and
filling the recess with a metal.

16. The method of claim 13, wherein producing the conductive path comprises:
depositing a metal on the barrier layer; and
performing an annealing step wherein the metal diffuses at least into the barrier layer and into the channel layer.

* * * * *